United States Patent
Nishioka et al.

(10) Patent No.: US 9,791,711 B2
(45) Date of Patent: Oct. 17, 2017

(54) IMAGE DISPLAY DEVICE

(75) Inventors: Ken Nishioka, Osaka (JP); Kenji Nagashima, Osaka (JP); Atsuya Hirano, Osaka (JP); Atsuhiko Chikaoka, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 431 days.

(21) Appl. No.: 13/811,476

(22) PCT Filed: Jul. 11, 2011

(86) PCT No.: PCT/JP2011/003966
§ 371 (c)(1),
(2), (4) Date: Jan. 22, 2013

(87) PCT Pub. No.: WO2012/011250
PCT Pub. Date: Jan. 26, 2012

(65) Prior Publication Data
US 2013/0120714 A1 May 16, 2013

(30) Foreign Application Priority Data
Jul. 23, 2010 (JP) ................................. 2010-166211

(51) Int. Cl.
*G02B 27/48* (2006.01)
*G03B 21/20* (2006.01)
(Continued)

(52) U.S. Cl.
CPC ......... *G02B 27/48* (2013.01); *G03B 21/2033* (2013.01); *G03B 33/06* (2013.01);
(Continued)

(58) Field of Classification Search
CPC .... G02B 27/48; G03B 21/2033; G03B 33/06; G03B 33/12; G03B 21/2053;
(Continued)

(56) References Cited

U.S. PATENT DOCUMENTS 5,597,223 A * 1/1997 Watanabe et al. .............. 353/97
2006/0023164 A1 * 2/2006 Sakaguchi et al. ............. 353/20
(Continued)

FOREIGN PATENT DOCUMENTS

| JP | 2006-047421 A | 2/2006 |
| JP | 2006-091471 A | 4/2006 |

(Continued)

OTHER PUBLICATIONS

International Search Report from PCT/JP2011/003966, with a filing date of Jul. 7, 2011, mailed on Aug. 9, 2011 from the Japanese Patent Office.

*Primary Examiner* — Christina Riddle
*Assistant Examiner* — Christopher Lamb, II
(74) *Attorney, Agent, or Firm* — Baker & Hostetler LLP

(57) ABSTRACT

To prevent effectively the flickering of an image due to the switching of a polarization direction while reducing speckle noise. A polarization switching unit is provided in an optical path of laser light to a projection surface A and periodically switches a polarization direction of the laser light emitted therefrom between p and S polarization. A laser control unit controls laser light sources in synchronization with the switching by the polarization switching unit and determines a driving current corresponding to a grayscale to be displayed on the basis of driving current characteristics for P polarization when the polarization direction of the laser light is the P polarization. In addition, the laser control unit determines the driving current corresponding to the grayscale to be displayed on the basis of the driving current characteristics for P polarization when the polarization direction of the laser light is the S polarization.

4 Claims, 5 Drawing Sheets

(51) Int. Cl.
*G03B 33/06* (2006.01)
*G03B 33/12* (2006.01)
*H04N 9/31* (2006.01)
*G09G 3/02* (2006.01)
*H01S 5/00* (2006.01)
*H01S 5/40* (2006.01)

(52) U.S. Cl.
CPC ............... *G03B 33/12* (2013.01); *G09G 3/02* (2013.01); *H04N 9/3129* (2013.01); *H04N 9/3167* (2013.01); *G09G 2360/145* (2013.01); *H01S 5/005* (2013.01); *H01S 5/4093* (2013.01)

(58) Field of Classification Search
CPC .............. G03B 21/206; G03B 21/2066; H04N 9/3129; H04N 9/3167; H04N 9/3155; H04N 9/3158; H04N 9/3161; H04N 9/3164; H04N 9/3182; H04N 9/3194; G09G 3/02; G09G 2360/145; G09G 3/025; H01S 5/4093; H01S 5/005
USPC ............... 353/20, 31, 33, 34, 37; 359/201.2, 359/485.06; 345/84, 690
See application file for complete search history.

(56) References Cited

U.S. PATENT DOCUMENTS

| | | | |
|---|---|---|---|
| 2006/0268241 A1* | 11/2006 | Watson et al. .................. | 353/94 |
| 2007/0153235 A1* | 7/2007 | Morikawa ............ | G02F 1/0136 353/20 |
| 2007/0252918 A1* | 11/2007 | Furuya et al. ................ | 348/742 |
| 2008/0165812 A1* | 7/2008 | Furuya et al. .................. | 372/22 |
| 2010/0232005 A1* | 9/2010 | Lescure ............... | G02B 27/104 359/279 |
| 2011/0285967 A1* | 11/2011 | Gollier ................ | H04N 9/3129 353/20 |
| 2011/0317130 A1* | 12/2011 | Gollier ................ | H04N 9/3129 353/20 |
| 2012/0019783 A1* | 1/2012 | Imai ............................... | 353/20 |
| 2012/0182487 A1* | 7/2012 | Konno ................ | G02B 27/286 349/7 |
| 2013/0016321 A1* | 1/2013 | Duelli .................... | G02B 27/48 353/20 |

FOREIGN PATENT DOCUMENTS

JP 2008-309827 A 12/2008
WO 2012/011250 A1 1/2012

\* cited by examiner

[FIG.1]
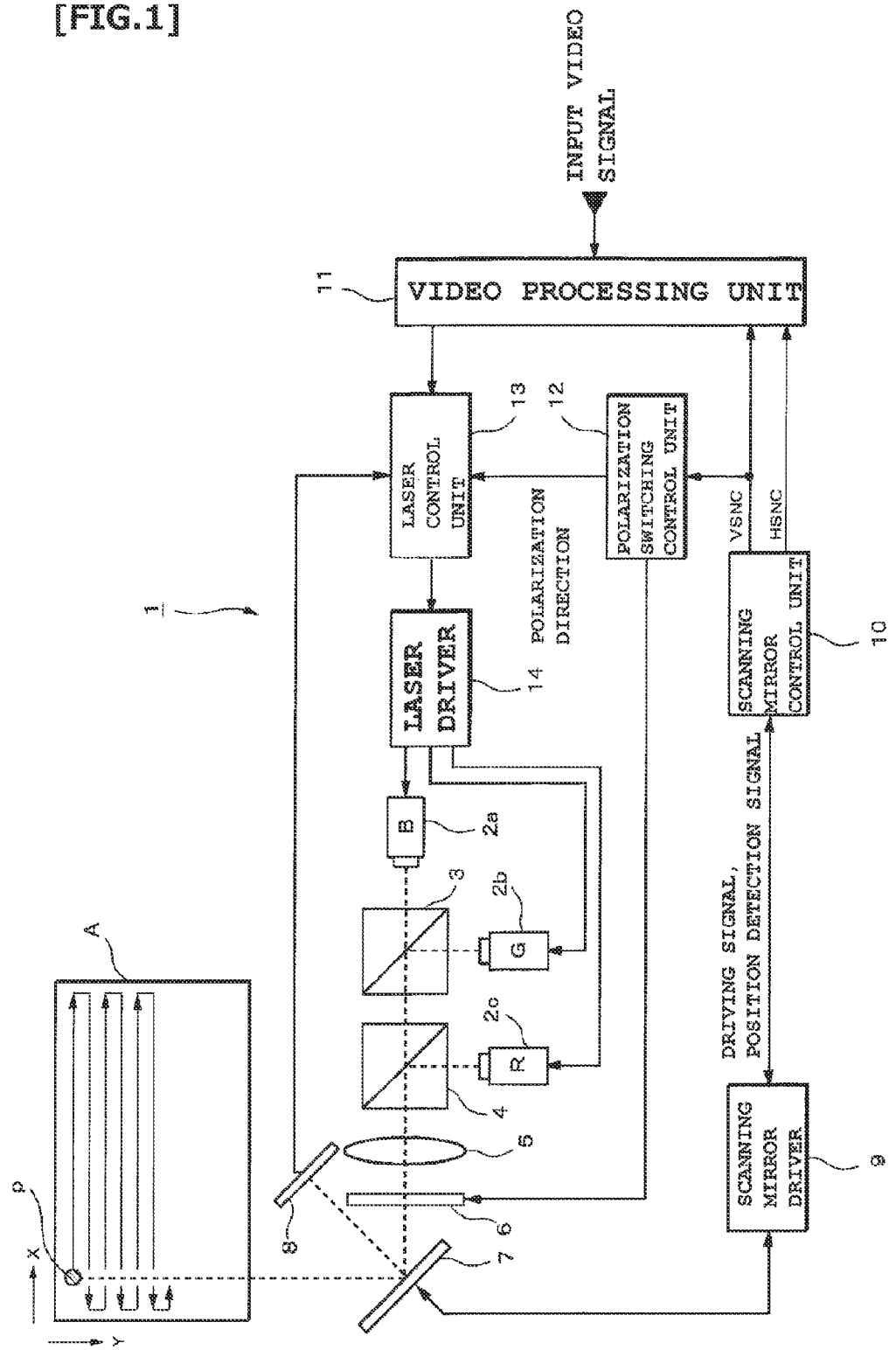

[FIG.2]
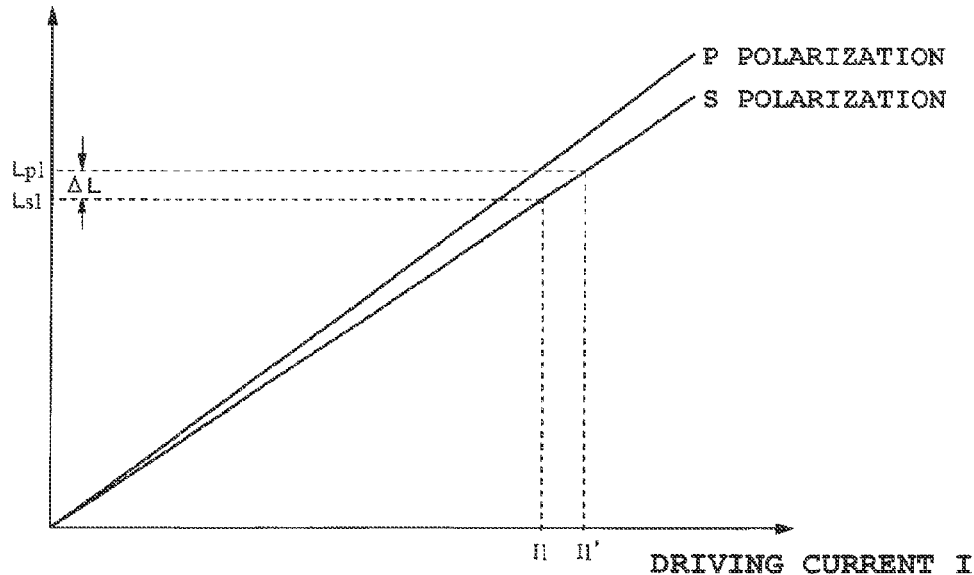
[FIG.3]
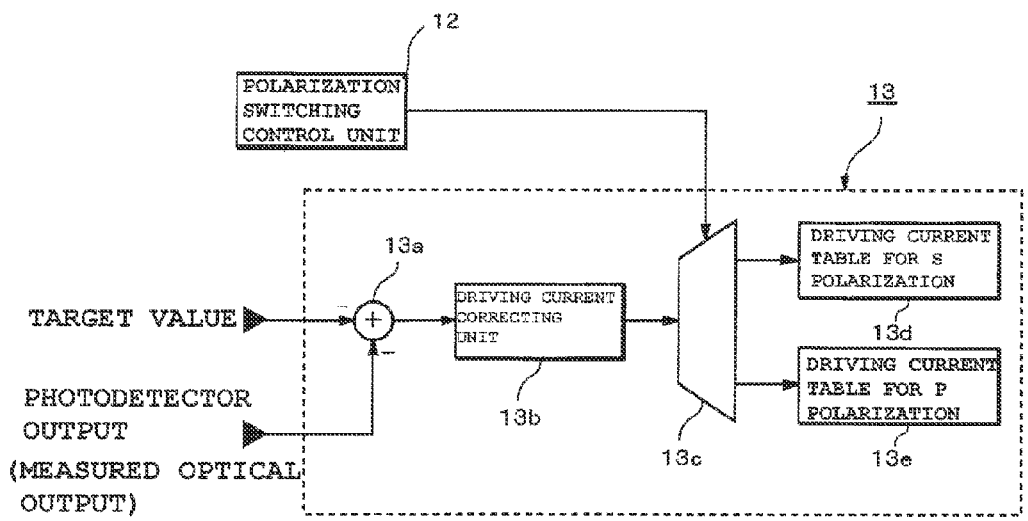

[FIG.4]
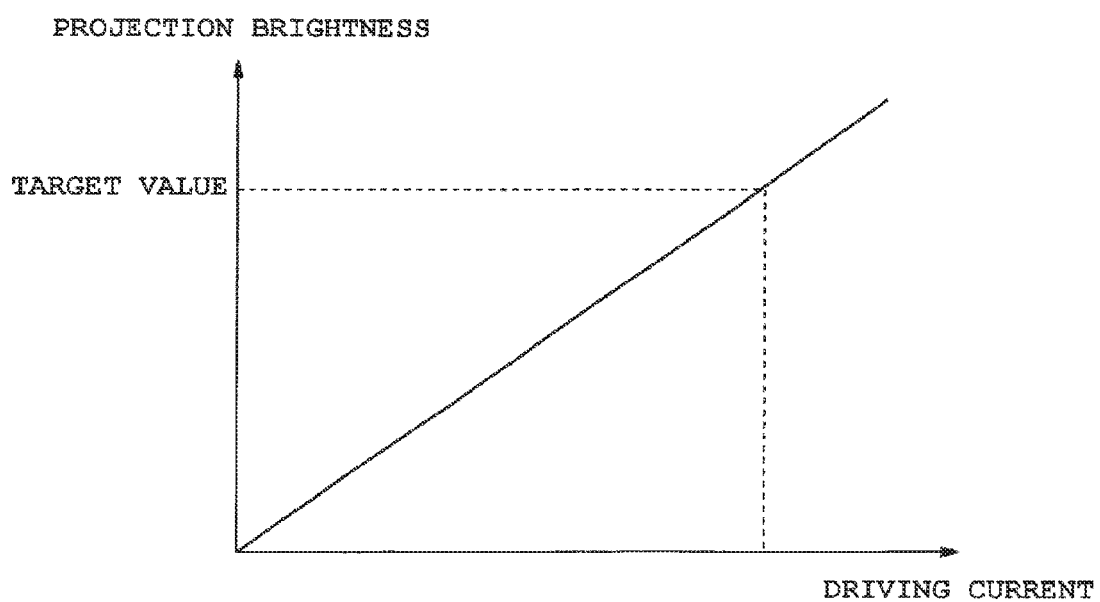

[FIG.5]
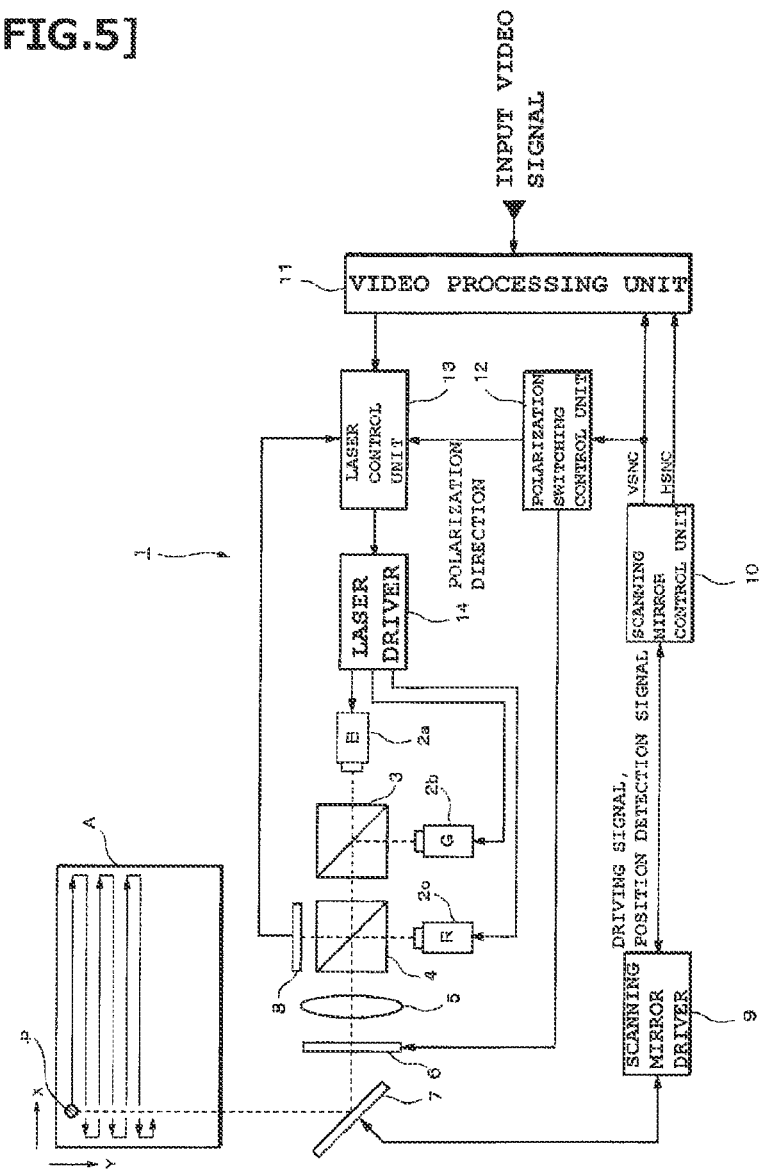
[FIG.6]
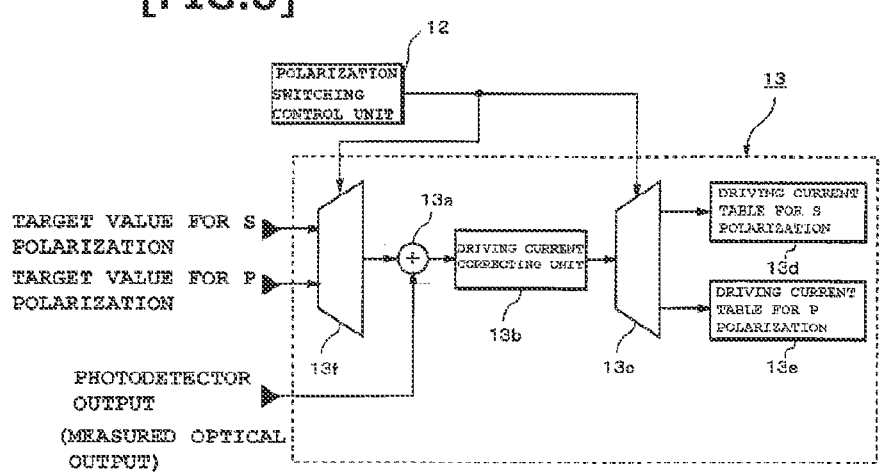

[FIG.7]
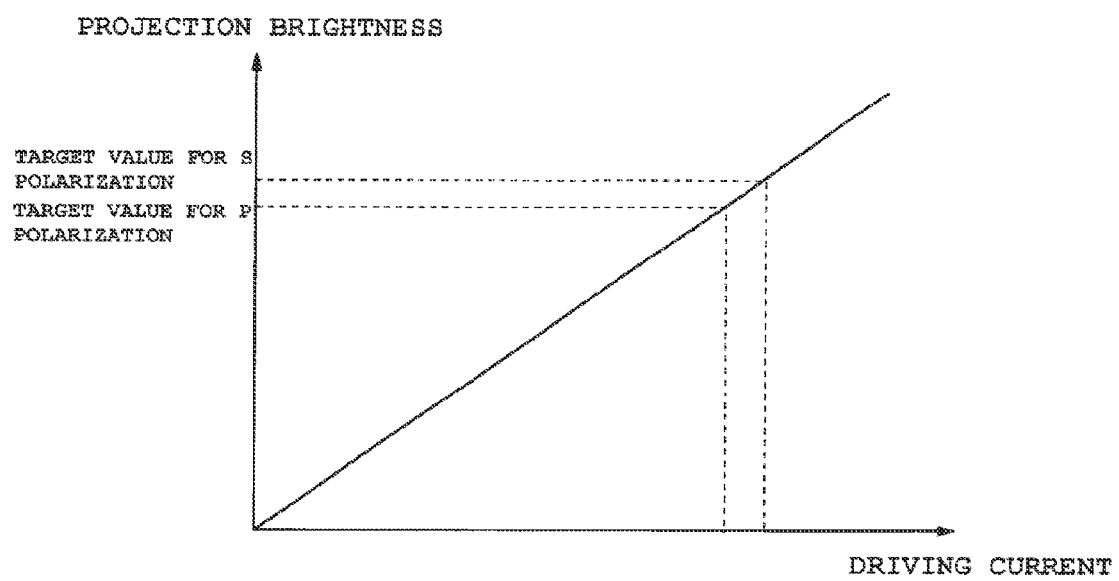

IMAGE DISPLAY DEVICE

CROSS-REFERENCE TO RELATED APPLICATIONS

The present application is a national stage entry of PCT/JP2011/003966, filed Jul. 7, 2011, which claims the benefit of Japanese Application Serial No. 2010-166211, filed Jul. 23, 2010.

TECHNICAL FIELD

The present invention relates to an image display device, and more particularly, to measures for speckle noise caused by switching between the polarization directions of laser light.

BACKGROUND ART

In image display devices using laser light, flickering with a minute speckle shape which is called speckle noise occurs due to the unique coherence (interference) of the laser light. In order to reduce the speckle noise, various methods have been proposed. As one of the methods, the Patent Literature 1 discloses a method which uses a spatial polarization control element to polarize beam components of the laser light in different directions. The polarization control element includes a first area (half-wave plate) and a second area (simple transmissive plate) and these areas are alternately arranged in the diametrical direction of the laser. Among P-polarized laser light components incident on the polarization control element, a beam component passing through the first area is S-polarized. On the other hand, a beam component passing through the second area is emitted as a P-polarized beam component without being polarized. In this way, the laser light passing through the polarization control element includes a P-polarized beam component and an S-polarized beam component. Since speckle patterns of P polarization and S polarization have a low correlation therebetween, the overlap therebetween makes it possible to reduce the speckle noise. In addition, the Patent Literature 2 discloses a method in which a half-wave plate is rotated by a motor to change the polarization direction of laser light passing through the wavelength plate over time. In this way, the speckle patterns with different polarization directions overlap each other over time and the speckle noise is reduced.

CITATION LIST

Patent Literature

[Patent Literature 1] JP-A-2006-47421
[Patent Literature 2] JP-A-2006-91471

SUMMARY OF INVENTION

Technical Problem

However, when the polarization directions of the laser light are different from each other, light transmission efficiency is different in the same optical system. Therefore, for example, in a case in which an image is displayed while the P polarization and the S polarization are switched in a predetermined cycle, even when a laser light source is driven by the same driving current, brightness is different due to the difference in the light transmission efficiency in each polarization direction and image flickering periodically occurs due to the brightness difference.

An object of the invention is to effectively prevent the image flickering due to switching between the polarization directions while reducing the speckle noise.

Solution to Problem

In order to solve the above-mentioned problems, the invention provides an image display device that includes a laser light source, an optical system, a polarization switching unit, and a laser control unit and projects laser light onto a projection surface to display an image on the projection surface. The laser light source emits the laser light with an optical output corresponding to a driving current. The optical system guides the laser light emitted by the laser light source so as to be projected onto the projection surface. The polarization switching unit is provided in an optical path of the laser light to the projection surface and periodically switches a polarization direction of the laser light emitted therefrom between a first polarization direction and a second polarization direction. The laser control unit controls the laser light source in synchronization with the switching by the polarization switching unit. The laser control unit determines the driving current corresponding to a grayscale to be displayed on the basis of first driving current characteristics when the polarization direction of the laser light is the first polarization direction. In addition, the laser control unit determines the driving current corresponding to the grayscale to be displayed on the basis of second driving current characteristics different from the first driving current characteristics when the polarization direction of the laser light is the second polarization direction.

In the invention, the first driving current characteristics and the second driving current characteristics may be set such that the optical output of the laser light emitted from the polarization switching unit is constant in the same grayscale, regardless of the switching between the first polarization direction and the second polarization direction.

The image display device according to the invention may further include: a photodetector that detects the amount of laser light in the optical path to the projection surface; and a driving current correcting unit that performs feedback correction on the first driving current characteristics and the second driving current characteristics such that the amount of laser light detected by the photodetector is close to a predetermined target value. In this case, the photodetector may detect the amount of laser light emitted from the polarization switching unit, and the driving current correcting unit may perform the feedback correction such that the target value is constant regardless of the switching between the first polarization mode and the second polarization mode. Alternatively, the photodetector may detect the amount of laser light incident on the polarization switching unit, and the driving current correcting unit may perform the feedback correction such that the target value is different when the polarization direction of the laser light is the first polarization direction and when the polarization direction of the laser light is the second polarization direction.

Advantageous Effects of Invention

According to the invention, when the polarization direction of the laser light is periodically changed, the characteristics of the driving current supplied to the laser light source are different in each polarization direction. Even when there is the difference in the light transmission efficiency of the optical system due to a difference in the polarization direction of the laser light, different driving current characteristics can be used to absorb the difference. As a result, it is possible to effectively prevent the image flickering due to a periodic change in brightness while reducing the speckle noise caused by the switching between the polarization directions.

BRIEF DESCRIPTION OF DRAWINGS

FIG. 1 A block diagram illustrating the structure of a laser projector according to a first embodiment.

FIG. 2 A characteristic diagram illustrating the relationship between a driving current and an optical output.

FIG. 3 A block diagram illustrating the structure of a feedback correction system according to the first embodiment.

FIG. 4 A diagram illustrating a target value according to the first embodiment.

FIG. 5 A block diagram illustrating the structure of a laser projector according to a second embodiment.

FIG. 6 A block diagram illustrating the structure of a feedback correction system according to the second embodiment.

FIG. 7 A diagram illustrating a target value according to the second embodiment.

DESCRIPTION OF EMBODIMENTS

First Embodiment

FIG. 1 is a block diagram illustrating the structure of a laser projector according to this embodiment. A laser projector 1 mainly includes laser light sources 2a to 2c, various optical elements 3 to 7 forming an optical system, which is an optical path of laser light, a photodetector 8, and various driving and control units 9 to 14. The laser projector 1 combines red, blue, and green laser light components and projects the combined light onto a projection surface A, such as a screen or a wall, such that a color image corresponding to a video signal is displayed on the projection surface A. Since the laser projector 1 uses laser light with very high directivity, it has the advantage that it is not necessary to adjust a focus according to the distance to the projection surface A.

The laser light sources 2a to 2c are independently driven by driving currents which are individually supplied from the laser driver 14. Therefore, laser light components with specific wavelengths are emitted from the laser light sources 2a to 2c. For example, a blue component (B) is emitted from the laser light source 2a, a green component (G) is emitted from the laser light source 2b, and a red component (R) is emitted from the laser light source 2c. The dichroic mirrors 3 and 4 transmit only laser light components with a specific wavelength and reflect the other laser light components, thereby combining the color laser light components emitted from the laser light sources 2a to 2c. Specifically, the blue and green laser light components emitted from the laser light sources 2a and 2b are combined by the dichroic mirror 3 which is arranged on the upstream side of the optical path and are then emitted to the dichroic mirror 4 which is arranged on the downstream side of the optical path. The combined light is further combined with the red laser light component emitted from the laser light source 2c by the dichroic mirror 4 and the combined light is emitted as final target color light. The emitted color light is incident on the polarization switching unit 6 through the lens 5.

The polarization switching unit 6 is provided in the optical path of the laser light to the projection surface A and periodically switches the polarization direction of the laser light emitted therefrom between P polarization and S polarization under the control of the polarization switching control unit 12. For example, JP-A-8-43788 discloses a liquid crystal element which can control a phase difference between orthogonal components Ex(p) and Ex(s) of an electric field of light using an AC control voltage as the polarization switching unit 6. An electrode is formed in a light receiving region of the liquid crystal element and the control voltage is applied to the electrode to adjust birefringence or optical rotation. A phase difference $\Delta\phi$ is uniquely specified by the following expression by changing birefringences n0 and ne using the control voltage.

$$\Delta\phi = 2\pi/\lambda \cdot (ne - n0) \cdot l \qquad \text{[Expression 1]}$$

ne: anomalous refractive index
n0: ordinary refractive index
l: crystal thickness
$\lambda$: wavelength of light In addition to the above-mentioned liquid crystal element, any known element may be used as the polarization switching unit 6. For example, a polarizing filter or a half-wave plate may be moved to implement the function of the polarization switching unit, or a Faraday element may be used which rotates the polarization surface of incident light using a magnetic field of a permanent magnet. In addition, the polarization switching unit 6 may be arranged at any position in the optical path to the projection surface A.

The scanning mirror 7 reflects the color light emitted from the polarization switching unit 6 according to its deflection angle (phase) such that the reflected light is projected onto the projection surface A. The scanning mirror 7 has two-dimensional flexibility corresponding to a horizontal direction X and a vertical direction Y of the projection surface A and performs line-sequential scanning corresponding to the two-dimensional displacement to form an image on the projection surface A. The line-sequential scanning is continuously performed in one frame by repeating a process of moving a laser spot p in one direction on a given horizontal line on the projection surface A and returning the laser spot p in the opposite direction on the next horizontal line. There are some types of scanning mirrors 7 according to driving methods and any type of scanning mirror may be used. A type of scanning mirror using a MEMS (Micro Electro Mechanical Systems) technique is easy to acquire and is advantageous in reducing the overall size and power consumption of a device and increasing the processing speed. An operation principle when the mirror is electromagnetically driven to perform scanning is as follows. The mirror which reflects laser light is attached to a substrate through two rotating shafts which are perpendicular to each other. When the driving current flows to a horizontal scanning coil, electromagnetic force is generated between the coil and a permanent magnet corresponding to the coil and the mirror attached to the substrate is swung about one rotating shaft by the electromagnetic force (horizontal scanning). When the driving current flows to a vertical scanning coil, electromagnetic force is generated between the coil and another permanent magnet corresponding to the coil and the mirror attached to the substrate is swung about the other rotating shaft by the electromagnetic force (vertical scanning). The driving currents for the horizontal scanning and the vertical scanning have a unique resonance frequency which is specified according to, for example, the dimensions of the mirror and the density and hardness of a material. The mirror is two-dimensionally displaced by the resonance frequency and is continuously oscillated at the maximum deflection angle. The details of the electromagnetically-driven mirror are disclosed in JP-A-2009-258321 and will be referred to, if necessary. In addition, there is a type of electromagnetically driven-scanning mirror in which only the horizontal scanning is performed by the resonance frequency and the vertical scanning is performed by DC (the phase is controlled according to the level of the current) and this type may be used as the scanning mirror 7.

The light reflected from the scanning mirror 7 is incident on the photodetector 8, such as a photodiode, provided in the vicinity of the scanning mirror 7. The photodetector 8 detects the amount of laser light in the optical path to the projection surface A, specifically, the amount of laser light emitted from the polarization switching unit 6. The amount of laser light detected by the photodetector 8 is fed back as a light amount detection signal to the laser control unit 13.

The scanning mirror driver 9 supplies the driving current to the scanning mirror 7 to drive the scanning mirror 7. In addition, the scanning mirror driver 9 detects the current position (phase) of the scanning mirror 7. Information about the detected position is transmitted as a position detection signal to the scanning mirror control unit 10. For example, the position of the scanning mirror 7 can be detected by providing torsion sensors in the rotating shafts (two shafts) which connect the mirror and the substrate and detecting the torsion angles of the rotating shafts which are operatively associated with the deflection angle of the mirror using the torsion sensors. In addition, a light receiving element (for example, a photodiode) may be arranged in the vicinity of the scanning mirror 7 and the position of the reflected light which is operatively associated with the deflection angle of the mirror may be detected by the light receiving element, thereby detecting the position of the scanning mirror 7.

The scanning mirror control unit 10 controls the scanning mirror 7 such that a predetermined image region is scanned with the laser light incident on the scanning mirror 7 at a predetermined frequency. The scanning mirror control unit 10 outputs a driving signal to the scanning mirror driver 9 to perform the above-mentioned control operation. The scanning mirror control unit 10 generates a horizontal synchronous signal HSNC and a vertical synchronous signal VSNC on the basis of the position detection signal from the scanning mirror driver 9 and outputs the generated signals to the video processing unit 11. The vertical synchronous signal VSNC is also output to the polarization switching control unit 12 since the polarization direction is switched in one frame unit. The laser light needs to be emitted from the laser light sources 2a to 2c in synchronization with the phase control of the scanning mirror 7. The horizontal and vertical synchronous signals HSNC and VSNC are used for the synchronization. That is, in the laser projector 1, the scanning mirror 7 is mainly driven and the laser light sources 2a and 2c are driven so as to be synchronized with the driving of the scanning mirror 7 on the basis of the internally generated horizontal and vertical synchronous signals HSNC and VSNC.

The polarization switching control unit 12 controls the polarization switching unit 6 on the basis of the vertical synchronous signal VSNC such that the P polarization and the S polarization are switched for every single frame. In addition, the polarization switching control unit 12 notifies the laser control 13 of the current polarization direction (P polarization and S polarization).

The video processing unit 11 frequently writes an input video signal (video data) supplied from an external device to a frame buffer (not shown) at the time defined by a synchronous signal supplied from the external device. In addition, the video processing unit 11 sequentially reads the video data stored in the frame buffer and transmits the video data to the laser control unit 13 at the time defined by the horizontal and vertical synchronous signals HSNC and VSNC supplied from the scanning mirror control unit 10.

The laser control unit 13 determines the driving current related to each pixel for each color component on the basis of the video data which is sequentially transmitted from the video processing unit 11. The laser light sources 2a to 2c are individually controlled and driven by the laser driver 14 on the basis of the driving current which is set for each color component. The driving current corresponding to the grayscale to be displayed is determined with reference to a driving current table in which driving current values to be set in each grayscale are described. This embodiment is characterized in that a plurality of driving current tables are prepared and the polarization switching unit 6 uses different driving current tables during the P polarization and the S polarization. A driving current table for P polarization and a driving current table for S polarization define different driving current characteristics. Next, this point will be described in detail with reference to FIG. 2.

FIG. 2 is a characteristic diagram illustrating the relationship between a driving current I and projection brightness L through the optical systems 3 to 7. It is assumed that, in order to display a given grayscale, a driving current Ip flows to drive the laser light source 2 (reference numeral 2 indicates any one of 2a to 2c). In this case, even when the optical output of the laser light emitted from the laser light source 2 is constant, light transmission efficiency of the optical system (in FIG. 1, the scanning mirror 7) which is arranged on the downstream side of the polarization switching unit 6 in the optical path is different during the P polarization and the S polarization. Therefore, the projection brightness L on the projection surface A is not constant. In the characteristics shown in FIG. 2, since the light transmission efficiency in the S polarization is lower than that in the P polarization, projection brightness Ls1 in the S polarization is less than projection brightness Lp1 in the P polarization (Ls1<Lp1). As a result, when the P polarization and the S polarization are switched for one frame, image flickering corresponding to a brightness difference ΔL occurs in one frame cycle. In order to prevent the flickering, the brightness difference ΔL caused by the difference in the light transmission efficiency may be predicted and the driving current I may increase or decrease in advance on the basis of the prediction result. That is, when the same projection brightness Lp1 as that in the P polarization is ensured in the S polarization, the driving current may be I1' which is more than I1 in the S polarization. When the driving currents I1 and I1' are alternately switched in synchronization with the switching between the P polarization and the S polarization, it is possible to effectively prevent the flickering when the same grayscale is displayed.

In general, the brightness difference ΔL between the P polarization and the S polarization when the same grayscale is displayed tends to increase as the driving current I increases, that is, as the optical output of the laser light source 2 increases. Therefore, the characteristics of the brightness difference ΔL in the entire grayscale region are specified by, for example, experiments or simulations and driving current characteristics may be set so as to compensate for a variation in the brightness difference ΔL. The characteristics shown in FIG. 2 relate to a case in which the light transmission efficiency in the P polarization is more than that in the S polarization. However, in some cases, the light transmission efficiency in the S polarization is more than that in the P polarization according to the optical systems.

Typically, a method in which the plurality of driving current tables are individually prepared is exemplified as a method of changing the driving current characteristics in the P polarization and the S polarization. However, the equivalent thereof may be implemented by, for example, the following methods. In any of the methods, the driving current characteristics are set such that the optical output (projection brightness L) of the laser light emitted from the polarization switching unit 6 is constant when the same grayscale is displayed, regardless of the switching between the P polarization and the S polarization in the polarization switching unit 6 (that is, in any mode of the P polarization and the S polarization).

(Method of Setting Driving Current Characteristics)

(1) Method of Using Basic Table and Correction Table

For example, during the P polarization, the driving current Ip corresponding to a display grayscale is determined with reference to a basic table. During the S polarization, a correction value (value corresponding to the display grayscale) in a correction table is added or subtracted to or from the driving current Ip to determine a driving current Is.

(2) Method of Using Driving Current Table and Correction Coefficient

For example, during the P polarization, the driving current Ip corresponding to the display grayscale is determined with reference to the driving current table. During the S polarization, a correction coefficient k is multiplied by the driving current Id to determine the driving current Is. The correction coefficient k may be constant in all grayscales or it may vary depending on a grayscale level.

(3) Method of Using Plural Expressions for Calculating Driving Current

For example, during the P polarization, a calculation expression for the P polarization is used to calculate the driving current Ip corresponding to the display grayscale. During the S polarization, an expression for the S polarization is used to calculate the driving current Is corresponding to the display grayscale.

(4) Method of Using Expression for Calculating Driving Current and Correction Coefficient For example, during the P polarization, the expression for calculating the driving current is used to determine the driving current Ip corresponding to the display grayscale. During the S polarization, the correction coefficient k is multiplied by the driving current Id to determine the driving current Is. The correction coefficient k may be constant in all grayscales or it may vary depending on a grayscale level.

(5) Method of Using Both Tables and Calculation Expressions

As variations of methods (1) to (4), the tables and the calculation expressions may be appropriately combined with each other.

The laser control unit 13 performs driving current feedback correction which is called APC (Auto Power Control) in real time on the basis of the amount of laser light (corresponding to the projection brightness L in this embodiment) detected by the photodetector 8 such that projection brightness is stabilized in each grayscale. FIG. 3 is a block diagram illustrating the structure of a feedback correction system having the laser control unit 13 as a main component. The feedback correction system mainly includes a differentiator 13a, a driving current correcting unit 13b, a selector 13c, and driving current tables 13d and 13e. The differentiator 13a calculates the difference between the amount of laser light (measured optical output) detected by the photodetector 8 and a predetermined target value. FIG. 4 is a diagram illustrating the target value according to this embodiment. In this embodiment, the photodetector 8 detects the amounts of P-polarized light and S-polarized light emitted from the polarization switching unit 6. Since the amounts of light substantially correspond to the projection brightness L, the desired projection brightness L (constant value) of the display grayscale may be the target value, regardless of the P polarization and the S polarization.

The driving current correcting unit 13b calculates a correction value for the driving current such that the difference calculated by the differentiator 13a is zero, that is, the measured optical output is close to the target value. The selector 13c selects one of the driving current table 13d for S polarization and the driving current table 13e for P polarization on the basis of the polarization direction (the P polarization or the S polarization) notified by the polarization switching control unit 12. In this way, the selector 13c selects the driving current table 13d for S polarization for the correction value which is calculated for the S polarization and the content of the table 13d is corrected. On the other hand, the selector 13c selects the driving current table 13e for P polarization for the correction value which is calculated for the P polarization and the content of the table 13e is corrected. Therefore, even when the optical output is changed due to an increase in the temperature of the laser light sources 2a to 2c, it is possible to effectively respond to the change while distinguishing the P polarization and the S polarization. The details of the APC are disclosed in JP-A-2006-332345 and JP-A-2010-14860 applied for by the applicant and will be referred to, if necessary.

As such, according to this embodiment, when the polarization switching unit 6 periodically switches the polarization direction of the laser light between the P polarization and the S polarization, the speckle patterns having low correlation therebetween overlap each other over time. Therefore, it is possible to reduce the speckle noise. At that time, the characteristics of the driving currents supplied to the laser light sources 2a to 2c vary depending on the polarization direction. Therefore, even when there is a difference in the light transmission efficiency of the optical system due to the difference between the polarization directions of the laser light, different driving current characteristics can be used to absorb the difference. As a result, it is possible to effectively prevent the image flickering due to a periodic change in brightness while reducing the speckle noise caused by the switching of the polarization direction.

Second Embodiment

FIG. 5 is a block diagram illustrating the structure of a laser projector according to this embodiment. This embodiment is characterized in that a photodetector 8 which detects the amount of laser light in the optical path of the optical system is arranged before a polarization switching unit 6, that is, the photodetector 8 is arranged in the vicinity of a dichroic mirror 4 to detect the amount of laser light (laser light before polarization) incident on the polarization switching unit 6. Since the other components are the same as those in the first embodiment, they are denoted by the same reference numerals as those in FIG. 1 and the description thereof will not be repeated in this embodiment.

FIG. 6 is a block diagram illustrating the structure of a feedback correction system having a laser control unit 13 as a main component. The structure shown in FIG. 6 differs from the structure shown in FIG. 3 in that a selector 13f which is controlled by a polarization switching control unit 12 is provided in the front stage of a subtractor 13a and selects a target value for S polarization and a target value for P polarization. In this case, feedback correction is performed while different target values are used when the polarization direction of the laser light is the P polarization and when the polarization direction of the laser light is the S polarization. Since the other components are the same as those in the first embodiment, they are denoted by the same reference numerals as those in FIG. 3 and the description thereof will not be repeated in this embodiment.

FIG. 7 is a diagram illustrating the target values according to this embodiment. In this embodiment, the photodetector 8 detects the amount of laser light before the laser light is incident on the polarization switching unit 6. As shown in FIG. 2, when light transmission efficiency in the P polarization is more than that in the S polarization, the brightness difference ΔL needs to be predicted and the driving current for the S polarization needs to increase. Therefore, different target values are individually set for the S polarization and the P polarization. Each of the target values may be set by, for example, experiments or simulations so as to specify the characteristics of the brightness difference ΔL in the entire grayscale region and compensate for a variation in the brightness difference ΔL.

As such, according to this embodiment, similarly to the first embodiment, it is possible to effectively prevent the image flickering due to a periodic change in brightness while reducing the speckle noise caused by the switching of the polarization direction. In addition, even when the optical output is changed due to an increase in the temperature of the laser light source 2a to 2c, it is possible to effectively respond to the change, while distinguishing the P polarization and the S polarization.

In each of the above-described embodiments, the polarization switching unit 6 performs the switching between the P polarization and the S polarization in one frame unit. However, the invention is not limited thereto. The switching may be performed in any cycle, such as in one pixel unit, one horizontal line unit, or one area unit. In addition, it is generally considered that the P polarization and the S polarization are switched at a ratio of 1:1. However, the P polarization and the S polarization are not necessarily switched at an equal ratio.

In each of the above-described embodiments, the color laser projector has been described. However, the invention can also be applied to a monochromatic laser projector. In addition, scanning means is not limited to the scanning mirror. For example, a known scanning unit, such as a DMD (Digital Micromirror Device) or an LCOS (Liquid crystal on silicon), may be used. In addition, when considering the essence of the invention, a display device without scanning means, that is, a display device which displays a grayscale image corresponding to one pixel on the projection surface A may be used, regardless of whether the scanning means is provided.

INDUSTRIAL APPLICABILITY

As described above, the invention can be widely applied to various image display devices which are typified by a laser projector as a representative example and project laser light onto a projection surface to display an image (including an image formed by one pixel) in grayscale on the projection surface.

REFERENCE SIGNS LIST

1: LASER PROJECTOR
2a to 2c: LASER LIGHT SOURCE
3, 4: DICHROIC MIRROR
5: LENS
6: POLARIZATION SWITCHING UNIT
7: SCANNING MIRROR
8: PHOTODETECTOR
9: SCANNING MIRROR DRIVER
10: SCANNING MIRROR CONTROL UNIT
11: VIDEO PROCESSING UNIT
12: POLARIZATION SWITCHING CONTROL UNIT
13: LASER CONTROL UNIT
13a: DIFFERENTIATOR
13b: DRIVING CURRENT CORRECTING UNIT
13c, 13f: SELECTOR
13d: DRIVING CURRENT TABLE FOR S POLARIZATION
13e: DRIVING CURRENT TABLE FOR P POLARIZATION
14: LASER DRIVER

The invention claimed is:

1. An image display device, comprising:
a laser light source that emits a laser light;
an optical unit that guides the laser light and projects the laser light onto a projection surface;
a polarization switching unit that is provided in an optical path of the laser light and periodically switches the laser light between a first polarization direction and a second polarization direction alternatively; and
a laser control unit that controls the laser light source in synchronization with the switching by the polarization switching unit, determines a first driving current corresponding to a grayscale to be displayed when the laser light is the first polarization direction, and determines a second driving current corresponding to the grayscale to be displayed when the laser light is the second polarization direction;
wherein the optical unit projects the laser light of the first polarization direction and the laser light of the second polarization direction onto the projection surface, and
the first driving current and the second driving current are set for the optical output of the laser light emitted from the polarization switching unit to become constant in a same grayscale, regardless of the switching between the first polarization direction and the second polarization direction.

2. The image display device according to claim 1, further comprising: a photodetector that detects the amount of laser light in the optical path; and a driving current correcting unit that performs feedback correction on the first driving current and the second driving current for the amount of laser light detected by the photodetector to become approximate to a predetermined target value.

3. The image display device according to claim 2, wherein the photodetector detects the amount of laser light emitted from the polarization switching unit, and the driving current correcting unit performs the feedback correction for the predetermined target value to become constant regardless of the switching between the first polarization direction and the second polarization direction.

4. The image display device according to claim 2, wherein the photodetector detects the amount of laser light incident on the polarization switching unit, and the driving current correcting unit performs the feedback correction for the predetermined target value to become different when the laser light is the first polarization direction and when the laser light is the second polarization direction.

\* \* \* \* \*